ically visible on the page.

United States Patent [19]
Peschke et al.

[11] Patent Number: 5,663,107
[45] Date of Patent: Sep. 2, 1997

[54] GLOBAL PLANARIZATION USING SELF ALIGNED POLISHING OR SPACER TECHNIQUE AND ISOTROPIC ETCH PROCESS

[75] Inventors: Matthias L. Peschke, Poughkeepsie; Reinhard J. Stengl, Wappinger Falls, both of N.Y.

[73] Assignee: Siemens Aktiengesellschaft, Munich, Germany

[21] Appl. No.: 362,399

[22] Filed: Dec. 22, 1994

[51] Int. Cl.[6] .................................................. H01L 21/82
[52] U.S. Cl. ........................... 438/692; 438/699; 438/437
[58] Field of Search ........................ 439/228 SE, 67 PL; 156/636.1, 657

[56] References Cited

U.S. PATENT DOCUMENTS

| | | | |
|---|---|---|---|
| 4,671,970 | 6/1987 | Keiser et al. | 427/93 |
| 4,836,885 | 6/1989 | Breiten et al. | 156/657 |
| 5,006,482 | 4/1991 | Kerbaugh et al. | 437/67 |
| 5,055,158 | 10/1991 | Gallagher et al. | 156/643 |
| 5,077,234 | 12/1991 | Scoopo et al. | 437/67 |
| 5,084,407 | 1/1992 | Boland et al. | 437/61 |
| 5,139,967 | 8/1992 | Sandhu et al. | 437/173 |
| 5,162,248 | 11/1992 | Dennison et al. | 437/52 |
| 5,169,491 | 12/1992 | Doan | 156/636 |
| 5,173,439 | 12/1992 | Dash et al. | 437/67 |
| 5,175,122 | 12/1992 | Wang et al. | 437/67 |
| 5,210,054 | 5/1993 | Ikeda et al. | 437/195 |
| 5,212,114 | 5/1993 | Grewal et al. | 437/192 |
| 5,223,734 | 6/1993 | Lowrey et al. | 257/401 |
| 5,229,331 | 7/1993 | Doan et al. | 437/228 |
| 5,270,241 | 12/1993 | Dennison et al. | 437/52 |
| 5,272,117 | 12/1993 | Roth et al. | 437/228 |
| 5,294,562 | 3/1994 | Lur et al. | 437/67 |
| 5,302,233 | 4/1994 | Kim et al. | 156/636 |
| 5,302,551 | 4/1994 | Iranmanesh et al. | 437/195 |
| 5,312,512 | 5/1994 | Allman et al. | 156/636 |
| 5,314,843 | 5/1994 | Yu et al. | 437/225 |
| 5,395,801 | 3/1995 | Doan et al. | 437/228 |
| 5,532,191 | 7/1996 | Nakano et al. | 437/228 |

*Primary Examiner*—John S. Chu
*Attorney, Agent, or Firm*—Adel A. Ahmed

[57] ABSTRACT

A method for globally planarizing an integrated circuit device wafer having a plurality of structures disposed on a surface thereof, the structures forming up and down features on the wafer's surface. The method involves depositing a fill layer over the surface of the wafer to cover the structures. Next, an etch mask layer is deposited over the fill layer. After the etch mask layer is fabricated, openings are formed in the etch mask layer to expose areas of the fill layer that are to be subsequently etched. This is accomplished in the first embodiment of the invention by creating self aligned openings in the etch mask layer using CMP if the gaps between the structures are only partially filled. If the gaps between the structures are completely filled, openings in the etch mask layer can be provided by patterning the etch mask layer using lithography and performing an optional spacer deposition and etching step as described in a second embodiment of the invention. In either case, the exposed areas of the fill layer are then etched to provide a second surface having up features that are substantially smaller than the up features originally defined on the surface of the wafer. In the final step of the method, the up features of the second surface are polished to provide a planarized wafer surface.

18 Claims, 3 Drawing Sheets

GLOBAL PLANARIZATION USING SELF ALIGNED POLISHING OR SPACER TECHNIQUE AND ISOTROPIC ETCH PROCESS

FIELD OF INVENTION

The present invention relates to a method for performing global planarization on a semiconductor wafer and more particularly to a method for global planarizing a semiconductor wafer using either chemical mechanical polishing (CMP) or photolithography with an optional spacer deposition and anisotropic etching, followed by an isotropic etch.

BACKGROUND OF THE INVENTION

Generally, the mass production of integrated circuits involves the fabrication of hundreds of identical circuit patterns on a single semiconductor wafer. The semiconductor wafer is then sawed into hundreds of identical chips or dies. These integrated circuits formed on the semiconductor wafer have become increasingly more complex. Modern integrated circuits are formed as multiple layers of conductive material or interconnect layers. When multiple layers of interconnect layers are employed, the integrated circuit develops a non-planar surface topography. Non-planar surfaces cause many problems in integrated circuits. These problems include voids in the dielectric materials, variations in the depth of focus causing photolithography resolution problems, damage caused by etching due to varying film thicknesses and film heights, and reductions in yield.

These problems can be avoided by planarizing the integrated circuit layers. Specifically, the doping, masking and etching techniques performed during semiconductor processing are more accurately performed when the wafer surface is planarized. For instance, a planarized surface maintains a constant depth of focus across the surface of the wafer when exposing patterns in a photolithography emulsion. This is very desirable for producing semiconductor structures in the deep sub micron range where the depth of focus is reduced during the photolithography process. The interconnecting layers are also optimized by planarizing after each process step. In particular, planarization of each interconnect layer provides each layer with a constant thickness across the surface of the wafer. This provides continuous interconnect lines across the surface of the wafer that would otherwise be discontinuous if the surface was non-planar and replete with cavities. Further, planarizing each integrated circuit layer allow finer interconnect lines to be fabricated in a given area thus increasing the circuit density. Additionally, devices having planar structures are more easily processed because substantially no corners or edges are present on the wafer surface where resist and other residuals can remain.

The planarity of a semiconductor wafer surface can be characterized according to the geometric patterns or pattern factors associated with the wafer. If planarity on the wafer is achieved independent of these pattern factors, such that planarity is achieved across the entire wafer surface, such planarization is characterized as global planarity. On the other hand, if planarity is achieved only for a specific pattern structure on the wafer surface, whereby steps and kinks are present at larger or smaller structures on other areas of the wafer surface, such planarity is characterized as local planarity.

Generally, there are two types of global planarization techniques presently used in the art. The first technique is planarization by spin on resist or by reflowing oxide. The second technique is planarization by chemical and mechanical removal of layers by polishing (CMP).

Planarization by spin on resist essentially comprises depositing a dielectric layer over the interconnection layer to be planarized. This is followed by spinning on an organic film like photoresist or polyamide, onto the rough dielectric layer. The dielectric and photoresist layers form a composite layer which is etched back to level the surface of the wafer. This is accomplished using a reactive ion etching technique that etches the dielectric and organic layer at the same rate.

Planarization by reflowing oxide involves depositing a thin dielectric layer by chemical vapor deposition (CVD) over the interconnection layer to be planarized. The dielectric layer is then heated to a temperature which is sufficient to at least partially melt the dielectric layer to cause it to flow into and fill the gaps thereby leveling the surface.

In both the spin on resist and reflow oxide techniques, the degree of planarization depends on the reflow length of either the resist or the oxide. For structures on the wafer that are much larger than the reflow length, the thickness of the planarizing layer increases relative to the smaller structures on the wafer. These thickness deviations will be reproduced in any subsequent etch-back procedure. Thus, in order to avoid such deviations, an additional photolithography step is used to generate additional filling structures within the cavities or down features on the wafer. Consequently, the planarizing resist or oxide layers will have the same height across the wafer.

There are, however, disadvantages related to the additional photolithography step which is implemented to achieve this result. Specifically, the masks used in this additional step can become very complicated. Moreover, it is difficult to obtain the same etch rate for the fill structures and for the planarizing layer.

Planarization by chemical and mechanical polishing involves depositing a layer of material over the substrate to be planarized. A rotating planar pad is applied to the wafer and grinds the layer of material to a planar surface. A chemical-liquid polishing compound, known in the art as slurry, is applied to the pad to aid in the planarization by etching the surface during polishing. The combined chemical and mechanical action of this technique rapidly removes the elevated portions of the deposited layer of material.

Planarization via CMP, is associated with some disadvantages relating to material removal rate from place to place on the wafer. For instance, the polishing rate of large up structures is slower than the polishing rate for small up structures. Further, in the case of large down features or trenches, dishing has been observed. Thus, because of these variations, additional planarization steps must be performed in order that global planarization by CMP can be successfully achieved.

These and other related global planarization techniques are described in U.S. Pat. No. 5,212,114 entitled PROCESS FOR GLOBAL PLANARIZING OF SURFACES FOR INTEGRATED SEMICONDUCTOR CIRCUITS, issued to Grewal et al. on May 18, 1993. In particular, this patent describes a process for globally planarizing the surfaces of integrated circuits wherein a locally planarized oxide film is etched back by using a photographic technique and a planarizing auxiliary layer.

Another global planarizing technique is described in U.S. Pat. No. 5,312,512 entitled GLOBAL PLANARIZATION USING SOG AND CMP, issued to Allman et al. on May 17, 1994. This technique employs a spin on glass (SOG) and an etching operation to remove high portions of the SOG and the deposition of an insulating layer prior to a chemical mechanical polish (CMP) operation.

It is accordingly an object of the present invention to provide an improved method for global planarizing the surface of a wafer having one or more integrated circuits formed thereon, which avoids the problems associated with prior art methods.

SUMMARY OF THE INVENTION

A method for globally planarizing an integrated circuit device wafer having a plurality of structures disposed on a surface thereof, the structures forming up and down features on the wafer's surface. The method involves depositing a fill layer over the surface of the wafer to cover the structures. Next, an etch mask layer is deposited over the fill layer. After the etch mask layer is fabricated, openings are formed in the etch mask layer to expose areas of the fill layer that are to be subsequently etched.

This is accomplished in the first embodiment of the invention by creating self aligned openings in the etch mask layer using CMP if the gaps between the structures are only partially filled. If the gaps between the structures are completely filled, openings in the etch mask layer can be provided by patterning the etch mask layer using lithography and performing an optional spacer deposition and etching step as described in a second embodiment of the invention.

In either case, the exposed areas of the fill layer are then etched to provide a second surface having up features that are substantially smaller than the up features originally defined on the surface of the wafer. In the final step of the method, the up features of the second surface are polished to provide a planarized wafer surface.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

Figure 1:
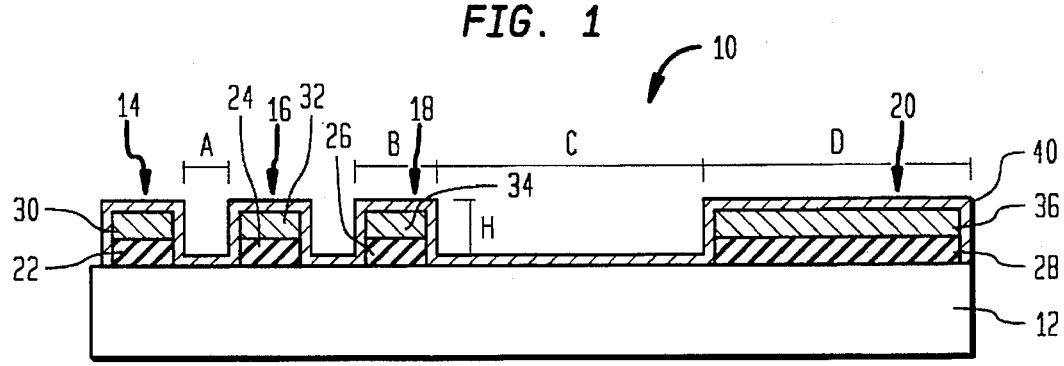
FIG. 1 shows a cross-section of a portion of a typical integrated circuit device wafer having sub micron structures to be planarized.

In FIG. 1, there is shown a typical integrated circuit device wafer 10 having sub micron structures to be planarized. The device 10 comprises a substrate 12 which includes sub micron active structures 14, 16, 18 and 20 comprising an array of patterned poly-silicon studs 22, 24, 26 and 28 fabricated directly on the top surface thereof. The studs are capped with respective nitride caps 30, 32, 34 and 36. A thin nitride liner 40 covers the nitride caps and the spaces or trenches between the poly-silicon studs which expose the top surface of the substrate 12. The structures have a step height equal to h. Further, the smaller structures 14, 16 and 18 have a width dimension b that typically ranges from 0.2 um to 1 um; the larger structure 20 having a width dimension c that typically ranges from 1 um to several millimeters. The smaller structures 14, 16, and 18 are typically spaced apart by trenches having a dimension ranging from 0.2 um to 1 um. The spacing between the small structure 18 and the larger structure 20 typically range from 1 um to several millimeters.

Figure 2:
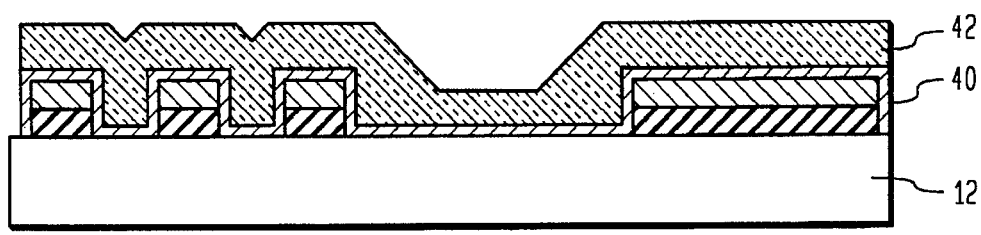
FIG. 2 depicts the structure of FIG. 1 after a fill layer has been formed thereover.
Figure 3:
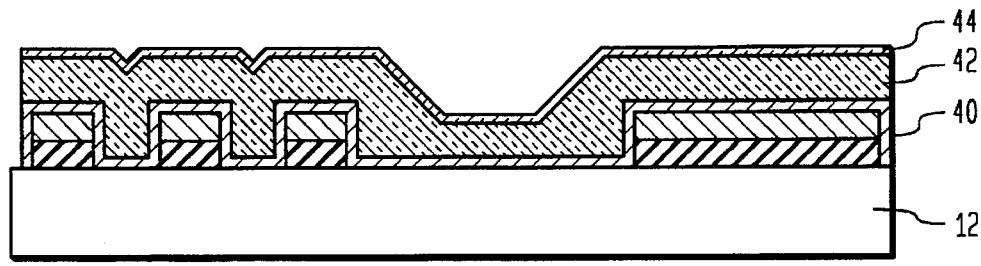
FIG. 3 depicts the structure of FIG. 2 after an etch mask layer has been formed over the fill layer.

The first processing step according to a first embodiment of the planarization method of the present invention will now be described with reference to FIG. 2. In the first processing step, a fill layer 42 is deposited over the nitride liner 40. The thickness of the fill layer 42 should be at least equal to the step height h of the up featured to be planarized. The fill layer 42 preferably comprises a borophosphosilicate glass (BPSG) which is typically employed in conventional wafer processing as a final protective coating on finished wafers. As is well known, BPSG comprises an SiO2 glass which has been doped with specific concentrations of boron and phosphorous to lower the melting point of the SiO2 from approximately 1200° C. to between 800° and 850° C. Lowering the melting point of the SiO2 is desirable for preventing heat related damage to the underlaying wafer circuitry as the glass is reflowed to fill the gaps between the up features. It should be noted that any other suitably doped SiO2 glass can be used as a fill material in the present invention if desired, such as phosphorous silicate glass (PSG). An etch mask layer 44 is thin deposited on top of the fill layer 42 as shown in FIG. 3. The etch mask layer 44 is preferably comprised of polysilicon, siliconnitride, boronnitride or any suitable diamond like film. In any case, the etch mask layer 44 should have a polish rate that is much lower than the polish rate of the fill layer 42.

Figure 4:
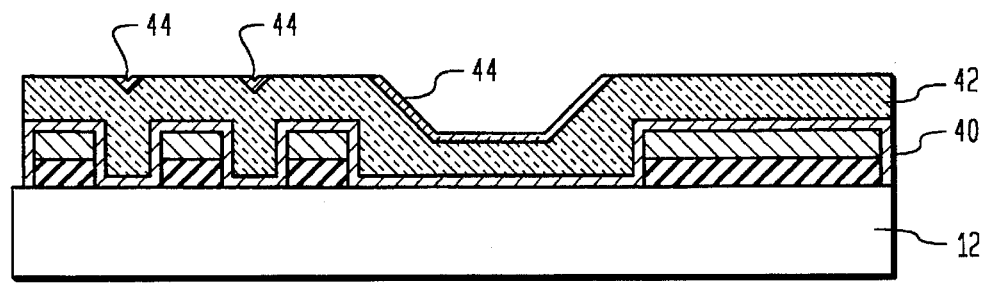
FIG. 4 depicts the structure of FIG. 3 after performing a first CMP.

At this stage of the method, a first CMP step is performed on the device wafer 10 shown in FIG. 3. This step is performed to remove the etch mask layer from the very top of the up features of the structures and is easily performed when the fill layer only partially fills the gaps between the structures as shown in the resulting wafer structure of FIG. 4. As earlier described in the background of the invention, CMP uses a rotating planar polishing pad wetted with a chemical-liquid polishing compound. The polishing pad is applied to the surface of the wafer to grind the sacrificial layer to a planner surface. In the first CMP step of the present invention, polishing with the rotating pad creates "self aligned" openings in the mask layer 44 over the areas of the fill layer 42 which are to be subsequently removed. This is accomplished in the present invention by employing a very hard polishing pad.

Figure 5:
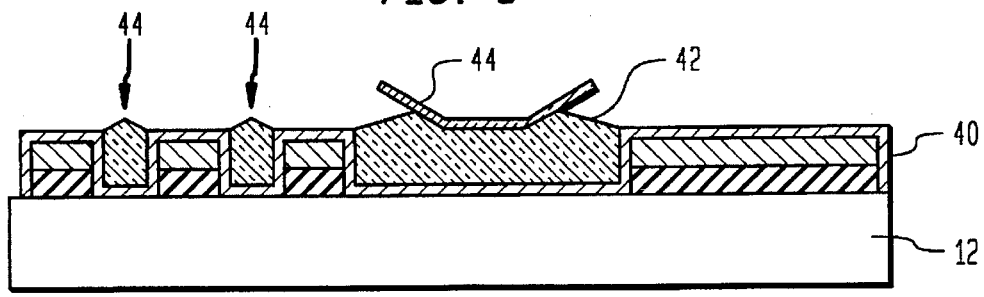
FIG. 5 depicts the structure of FIG. 4 after etch back of the fill layer.
Figure 6:
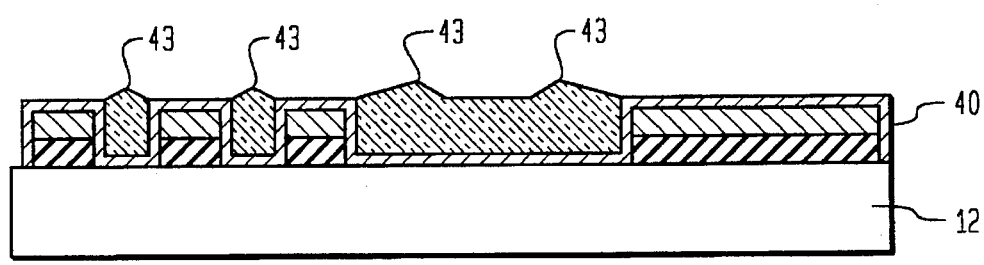
FIG. 6 depicts the structure of FIG. 5 after dry etching of the remaining etch mask layer.

After performing the first CMP step, the portions of the fill layer 42 exposed by the "self aligned" openings in the mask layer 44 are isotopically back-etched. The fill layer 42 is etched down to the top of the nitride liner 40 which operates as an etch stop. Isotropic etching is preferably accomplished in the present invention by wet etching in HF although any other suitable method can be used. As shown in FIG. 5, isotopically etching the fill layer 42 to a distance approximately equal to h results in "shark teeth" like structure in the remaining fill layer along the corners and edges of the up features which are greater the 1 um. The height of these "teeth" will be less than h/2 if at least the thickness h is etched. The width of the teeth is also on the order of the filling layer 42 thickness. The exact value of t depends on the edge overage of the fill layer 42, since s decreases with decreasing edge coverage. In the case of small structures with distances from each other which approximate the thickness h, the value s becomes even smaller and the etch mask layer 44 becomes suspended as shown in FIG. 5. In FIG. 6, these remaining portions of the etch mask layer 44 have been selectively removed by dry etching.

Figure 7:
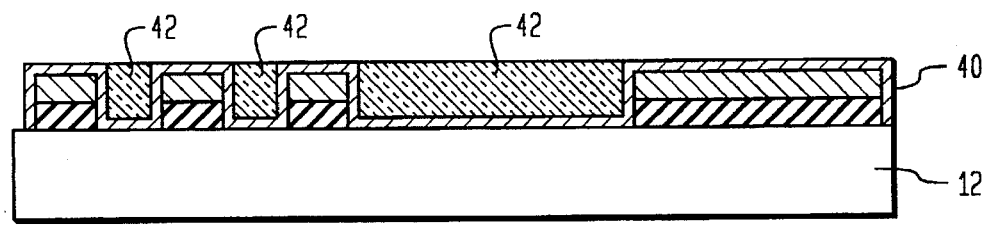
FIG. 7 depicts the structure of FIG. 6 in the final planarized form after performing a second CMP.

The final step in the first embodiment of the present invention comprises a second CMP step in which the remaining teeth structures shown FIG. 6 are removed. This step is very effectively performed because these remaining up features are relatively small. FIG. 7, illustrates the resulting planarized device wafer after performing the second CMP.

The above described embodiment of the present invention is easily implemented in situations where it is possible to open up small windows using CMP for isotropic fill film etching according to the "self aligned openings" technique described above. There are situations, however, when this technique can not be successfully implemented.

For example, in situations where the gaps between the structures becomes completely filled by the fill layer, it is not possible to open up small windows in the etch mask layer during the first CMP step because the polishing operates to completely remove the etch mask layer in the area of these gaps. This situation arises when 2*q*h is greater than b, where h is the thickness of the fill layer deposited on the top of the structures and q describes the structure sidewall coverage compared to h, where q is greater than 0 but less than 1.

Figure 8:
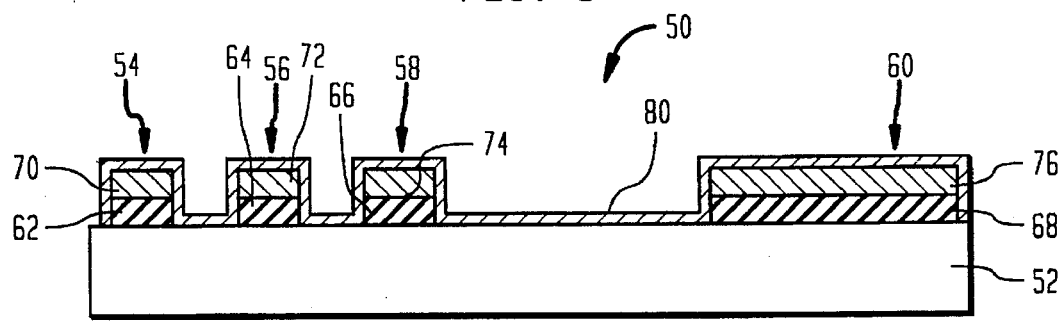
FIG. 8 shows a cross-section of a portion of another typical integrated circuit device wafer to be planarized.

Such situations are addressed by a second embodiment of the present invention which will now be described in conjunction with FIGS. 8–11. In FIG. 8 there is shown an integrated circuit device wafer 50 which is similar to the device wafer shown in FIG. 1. The device wafer 50 comprises a substrate 52 which includes sub micron structures 54, 56, 58 and 60 comprising an array of patterned polysilicon studs 62, 64, 66 and 68. The studs are capped with respective nitride caps 70, 72, 74 and 76 and covered with a thin nitride liner 80, the nitride liner 80 also covering the spaces or trenches between the studs which expose the top surface of the substrate 52.

The first two processing steps according to the second embodiment of the invention are essentially identical to the first two processing steps performed in the earlier described first embodiment of the invention.

They involve depositing a fill layer 82 over the nitride liner 80. This is then followed by the deposition of an etch mask layer 84. When the fill layer 82 completely fills the gaps between the structures, this creates the situation described immediately above, where small windows in the etch mask layer can not be created during by CMP because the polishing operates to completely remove the etch mask layer in the area of these gaps.

Figure 9:
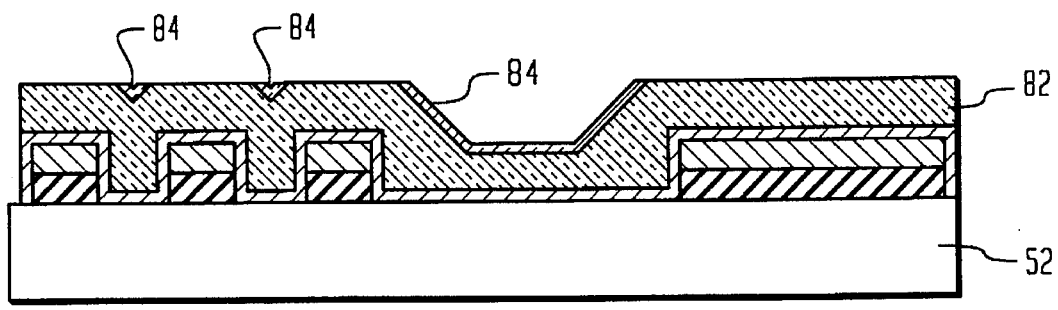
FIG. 9 depicts the structure of FIG. 8 after performing lithography according to a second embodiment of the present invention.

This situation is addressed in the present invention by performing a lithography step on the etch mask layer as shown in FIG. 9. This provides patterned openings in the etch mask layer, these openings operating to expose the areas of the underlying fill layer which are to be subsequently etched. The lithography step can be performed by using a reversed mask of the underlying structure or by using the identical mask of the underlying structure and changing from a positive to negative resist or vice versa.

Regardless of how the lithography step is performed, because misalignment is typically on the order of 30 nm to 100 nm, it will be necessary to make the openings in the etch mask layer smaller by at least 30 nm to 100 nm to compensate for the misalignment. If this compensation is not made, substantially more of the fill layer will be etched during the isotropic back etching performed later in the process.

Such compensation, however, may not be easily made for sub micron structures since it may become impossible to achieve such small openings using mere lithography. If this is the case, an optional spacer fabrication technique is provided in the second embodiment of the present invention to reduce the originally large openings.

Figure 10:
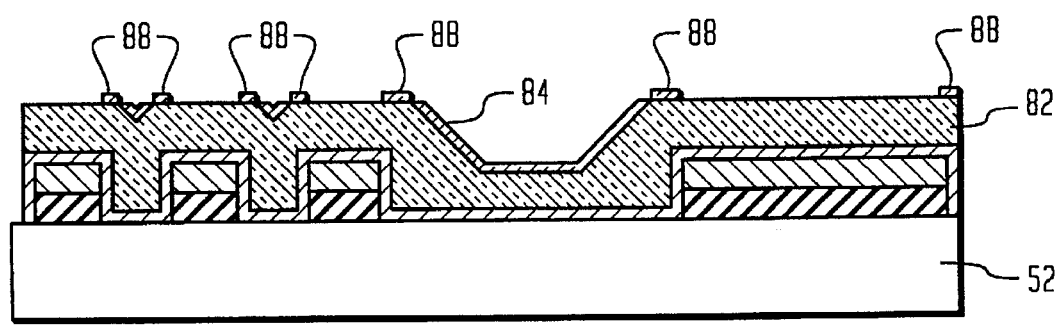
FIG. 10 depicts the structure of FIG. 9 after fabricating spacers.

The spacer fabrication technique of the present invention involves depositing a second mask layer 86 of polysilicon or the like on top of the patterned etch mask layer 84. The second mask layer 86 should be deposited to have a thickness of between 30 nm and 100 nm. Once deposited, the second mask layer 86 is anisotropically etched to leave spacers 88 of about 30 nm to 100 nm width at the boundary of the openings. As can be seen in FIG. 10, the spacers 88 reduce the width of the openings in the patterned etch mask layer 84.

The anisotropic etch process described above, ensures that during the subsequent isotropic etching step, large areas of the etch mask layer 82 do not become suspended and uncontrollably lift off. Further, the depth of the anisotropic etch is performed to the depth t, which is typically 20 nm–30 nm or 10% of the structure thickness. Accordingly, process tolerance still guarantees, that the edges of the active structures do not become over-etched.

Figure 11:
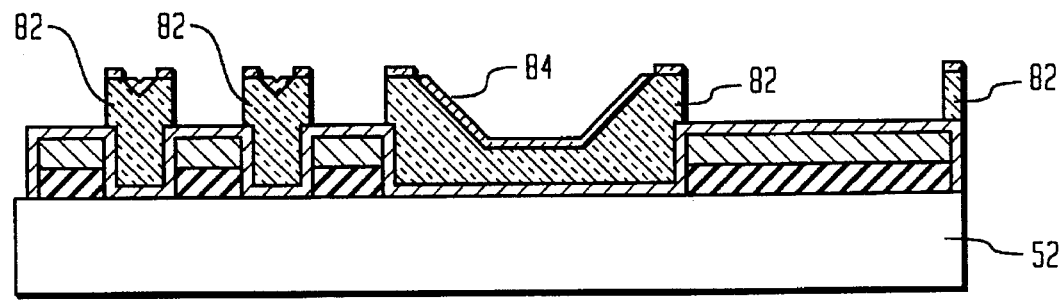
FIG. 11 depicts the structure of FIG. 10 after etch back of the fill layer.

After performing the lithography step and if necessary, the optional spacer fabrication technique, the fill layer 82 is isotropically etched using any well known technique such as wet etching in HF. This etching extends down to the top of the etch stop nitride liner layer 80 as shown in FIG. 11.

Further planarization is performed as per the first embodiment of the invention. First, the remaining portions of the etch mask layer 84 are selectively removed by any well known dry etching technique. Then, a CMP step is performed to remove any remaining teeth structures to provide a planarized device wafer.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

We claim:

1. A method for globally planarizing an integrated circuit device wafer having a plurality of structures disposed on a surface thereof, said structures forming up and down features on said surface, said method comprising the steps of:

depositing a fill layer over said surface of said wafer to cover said structures;

depositing an etch mask layer over said fill layer;

forming openings in said etch mask layer to expose areas of said fill layer to be etched;

fabricating spacers at the boundary of said openings to reduce the width of said openings;

etching said exposed areas of said fill layer to provide a second surface having up features that are substantially small relative to said up features defined on said surface of said wafer; and removing said up features of said second surface to provide a planarized wafer surface.

2. The method according to claim 1, wherein said fill layer has a given rate of etching and said etch mask layer has a rate of etching that is substantially lower than said given rate of etching.

3. The method according to claim 1, wherein said fill layer comprises a borophosphosilicate glass.

4. The method according to claim 1, wherein said fill layer is deposited to a thickness approximately equal to at least the height of said structures.

5. The method according to claim 1, wherein said step of forming openings in the etch mask layer is performed by chemically mechanically polishing said etch mask layer to create self aligned openings.

6. The method according to claim 1, wherein said step of forming openings in the etch mask layer is accomplished by patterning said etch mask layer using lithography.

7. The method according to claim 1, wherein said step of fabricating spacers includes depositing a second etch mask layer over said patterned etch mask layer.

8. The method according to claim 7, wherein said step of etching said second etch mask layer comprises anisotropic etching.

9. The method according to claim 8, wherein said step of etching said fill layer comprises isotropic etching.

10. The method according to claim 1, wherein said step of removing comprises chemically mechanically polishing said up features to provide a planarized wafer surface.

11. The method according to claim 1, wherein said step of etching comprises isotropic etching.

12. A method for planarizing an entire surface of an integrated circuit device wafer, said surface having disposed thereon a plurality of spaced apart structures which form up and down features, said method comprising the steps of:

depositing a fill layer over said entire surface, said fill layer partially filling the spaces between said structures;

depositing an etch mask layer over said fill layer;

defining openings in said etch mask layer to expose areas of said fill layer to be etched;

depositing a second etch mask layer over said etch mask layer for forming spacers to reduce said given width of said openings;

etching said exposed areas of said fill layer to create a new surface having up features that are substantially smaller than said up features originally defined on said entire surface of said wafer; and polishing said up features of said second surface to provide a planarized wafer surface.

13. The method according to claim 12, wherein said step of defining openings in said etch mask layer comprises chemically mechanically polishing said etch mask layer to provide self aligned openings in said etch mask layer.

14. The method according to claim 12, wherein said step of polishing comprises chemical mechanical polishing.

15. A method for planarizing an entire surface of an integrated circuit device wafer, said surface having disposed thereon a plurality of spaced apart structures which form up and down features, said method comprising the steps of:

depositing a fill layer over said entire surface, said fill layer completely filling the spaces between said structures;

depositing an etch mask layer over said fill layer;

defining openings of a given width in said etch mask layer to expose areas of said fill layer to be etched;

reducing said given width of said openings by depositing a second etch mask layer over said patterned etch mask layer and etching said second etch mask layer to provide spacers at the boundary of said openings to reduce said width of said openings;

etching said exposed areas of said fill layer to create a new surface having up features that are substantially smaller than said up features originally defined on said entire surface of said wafer; and chemically mechanically polishing said up features of said second surface to provide a planarized wafer surface.

16. The method according to claim 15, wherein said step of defining openings in said etch mask layer comprises the step of patterning said etch mask layer.

17. The method according to claim 16, further including the step of reducing said given width of said openings by depositing a second etch mask layer over said patterned etch mask layer and etching said second etch mask layer to provide spacers at the boundary of said openings to reduce said width of said openings.

18. The method according to claim 15, wherein said step of etching said second etch mask layer comprises anisotropic etching and said step of etching said exposed areas of said fill layer comprises isotropic etching.

\* \* \* \* \*